United States Patent [19]
Yoon

[11] Patent Number: 5,946,232
[45] Date of Patent: Aug. 31, 1999

[54] FLASH MEMORY DEVICE AND METHOD THAT OPERATES A MEMORY CELL ARRAY IN SECTOR UNITS

[75] Inventor: Yeon-Joong Yoon, Choongcheongbuk-Do, Rep. of Korea

[73] Assignee: LG Semicon Co., Ltd., Cheongju, Rep. of Korea

[21] Appl. No.: 09/159,658

[22] Filed: Sep. 24, 1998

[30] Foreign Application Priority Data

Mar. 12, 1998 [KR] Rep. of Korea .................. 98-8273

[51] Int. Cl.[6] .................. G11C 16/04; G11C 16/06
[52] U.S. Cl. .................. 365/185.11; 365/185.13; 365/185.23; 365/185.33
[58] Field of Search .................. 365/185.11, 185.13, 365/185.23, 185.29, 185.33, 218, 230.03, 230.06

[56] References Cited

U.S. PATENT DOCUMENTS

| | | | |
|---|---|---|---|
| 5,065,364 | 11/1991 | Atwood et al. | 365/185.13 |
| 5,245,570 | 9/1993 | Fazio et al. | 365/185.13 |
| 5,270,980 | 12/1993 | Pathak et al. | 365/185.23 |
| 5,280,447 | 1/1994 | Hazen et al. | 365/185.11 |
| 5,329,488 | 7/1994 | Hashimoto | 365/185.13 |
| 5,740,108 | 4/1998 | Okubo | 365/185.23 |
| 5,748,528 | 5/1998 | Campardo et al. | 365/185.11 |
| 5,848,000 | 12/1998 | Lee et al. | 365/185.23 |

*Primary Examiner*—Trong Phan
*Attorney, Agent, or Firm*—Fleshner & Kim

[57] ABSTRACT

A semiconductor device and method is providing having a memory cell array divided into a plurality of sectors and an erasing operation is preferably performed by sectors. The sectors are sub-divided into two or more sub-sectors, and at least one word line inside each of the sub-sectors is commonly coupled to another word line inside a different sub-sector. Thus, a plurality of word lines can be commonly coupled to a single word line decoder. Accordingly, a number of required word line decoders for the semiconductor device is reduced. Further, size and power requirements of the semiconductor device can be reduced.

16 Claims, 5 Drawing Sheets

FIG.3
CONVENTIONAL ART

| CELL TERMINAL | READ | WRITE | ERASE |
|---|---|---|---|
| GATE | VCC | 8V~10V | -8V~-12V |
| DRAIN | 1V~1.5V | 5V~7V | FLOATING |
| SOURCE | 0V | 0V | 5V~7V |

FLASH MEMORY DEVICE AND METHOD THAT OPERATES A MEMORY CELL ARRAY IN SECTOR UNITS

BACKGROUND OF THE INVENTION

1. Field of the Invention

The present invention is directed to memory device, and in particular, to a flash memory device in which a memory cell array is divided into a plurality of sector units.

2. Background of the Related Art

An Electrically Programmable Read-Only Memory (EPROM) is a flash memory device that users can program byte by byte with data. When an erasing operation is performed, the data stored in each cell of a memory cell array are erased, and the EPROM can subsequently be re-programmed again.

The data stored in all the cells of the memory cell array can be erased at one time by an erasing operation. To prevent the data stored in all the cells from being erased at one time, a conventional memory cell array is divided into a plurality of sectors, and the erasing operation is performed by sectors. For instance, U.S. Pat. No. 5,245,570 titled "Floating gate non-volatile memory blocks and select transistors" discloses such conventional art.

FIG. 1 is a schematic diagram illustrating a conventional flash memory device. As illustrated in FIG. 1, the flash memory device includes a memory cell array 10, a plurality of word line decoders 21~26, a bit line decoder 30, and a plurality of sector select decoders 41, 42 that divide the memory cell array 10 into a plurality of memory sectors 11, 12. Respective memory cells of the memory cell array 10 are commonly connected to the word line decoders 21~26 through word lines W/L1, W/L2, . . . , W/Ln and to the bit line decoder 30 through global bit lines B/L1, B/L2, . . . , B/Ln.

The memory sectors 11, 12 respectively include sector select units 110, 120. In accordance with an operation of the sector select decoders 41, 42, the sector select units 110, 120 control the connection between each cell of the memory sectors 11, 12 and the bit line decoder 30.

FIG. 2 is a detailed diagram illustrating the memory cell array of in FIG. 1. The gates of the cells E11~En4 of the memory sector 11 are respectively connected to the word lines W/L1~W/Ln and the drains of the cells E11~En4 are connected to local bit lines B/LL1~B/LL4. The local bit lines B/LL1~B/LL4 commonly connect the drains of memory cells of the memory cell array 10 located in corresponding columns. In addition, the sources of the respective cells inside the memory sector 11 are commonly connected. The sector select unit 110 includes a plurality of select transistors L1~T4 for selectively connecting the local bit lines B/LL1~B/LL4 with the global bit lines B/L1, B/L2. The gates of the select transistors L1~T4 are connected to the sector select decoder 41 through sector select lines SL1, SL2. As shown in FIG. 2, the plurality of select transistors L1~T4 are NMOS transistors.

The operation of the conventional flash memory device of FIGS. 1 and 2 will now be described. When the sector select decoder 41 outputs a predetermined voltage through one of the sector select lines SL1, SL2 under the condition that one of the word lines W/L1~W/Ln and one of the global bit lines B/L1, B/L2 are enabled, one of the memory cells E11~En4 in the memory sector 11 is selected. For example, when the sector select decoder 41 outputs a high-level voltage through the sector select line SL1 and outputs a low-level voltage through the sector select line SL2, the select transistors T2, T4 with their gates connected to the sector select line SLI are turned on. Further, the select transistors L1, T3 with their gates connected to the sector select line SL2 are turned off. As the select transistors T2, T4 are turned on, the global bit lines B/L1, B/L2 are respectively connected to the local bit lines B/LL2, B/LL4. If the first word line W/L1 and the first global bit line B/L1 are enabled, memory cell E12 is selected.

The reading, writing and erasing operations will now be described with reference to FIG. 3. The reading and writing operations are performed using the respective word lines, but the erasing operation is simultaneously performed on all the memory cells inside the entire sector.

FIG. 3 indicates the voltage levels applied to the respective terminals of the memory cell while the reading, writing and erasing operations are performed. As shown in FIG. 3, the reading operation is performed on a selected memory cell when a word line voltage, which is a gate voltage of the selected memory cell, is a power supply voltage VCC, a bit line voltage, which is a drain voltage, is in the range between 1 V and 1.5 V and a ground voltage, which is a source voltage, is 0 V.

As shown in FIG. 3, the writing operation is performed on the selected memory cell when a voltage of 8 V to 10 V is applied to the gate, a voltage of 5 V to 7 V is applied to the drain and a voltage of 0 V is applied to the source of the selected memory cell. During the writing operation, electric charges may move from a substrate to a floating gate, and thereby a disturbance phenomenon may occur to the memory cells in the proximity of the memory cells connected to the same word line. To prevent such disturbance phenomenon, the gate voltage should be limited to a proper value.

As further shown in FIG. 3, the erasing operation is performed when a voltage of −8 V to −12 V is applied to the gate of the selected memory cell, a voltage of 5 V to 7 V is applied to the source, and the drain is in a floating condition. That is, when the corresponding select transistor is turned off, the drain of the memory cell being connected to the select transistor is put in a floating condition. In the case that the voltage of the word line is set to be between −8 V to −12 V, the data of the selected memory cell is erased. Meanwhile, as the respective gate voltages of the cells in sectors (e.g., sector 12 not illustrated) not selected are set to be 0 V, the erasing operation is not performed thereon.

The erasing operation is simultaneously performed on all the memory cells E11~En4 inside the entire memory sector 11. That is, when a voltage of −8 V to −12 V is applied through the word lines W/L1~W/Ln and the select transistors T1~T4 are turned off, the erasing operation is performed on all the memory cells E11~En4 at the same time.

As described above, the conventional flash EPROM has various disadvantages. In the conventional flash EPROM art, to enable the memory cells during the erasing and writing operations, a word line decoder is required for each word line. Accordingly, if there are 256 word lines, 256 word line decoders must be correspondingly provided. Layout is important in a semiconductor integrated circuit. Size of the memory cells can be decreased to reduce the entire layout. However, even if the size of the memory cells is decreased, unless the design of the peripheral circuits is reduced, it is difficult or impossible to position the word line decoders fitting to the size of the cells. Therefore, even with decreased cell size, if the word line decoder size is not reduced, the size of the word line decoder is relatively increased. Accordingly, to decrease the size of the layout efficiently, it is necessary to reduce a proportion of the word line decoder layout in the entire layout.

The above references are incorporated by reference herein where appropriate for appropriate teachings of additional or alternative details, features and/or technical background.

SUMMARY OF THE INVENTION

An object of the present invention is to provide a semiconductor device and method that substantially obviates one or more of the problems or disadvantages caused by the related art.

Another object of the present invention is to provide a reduced size memory device that operates a memory cell array divided into sectors.

Another object of the present invention is to provide a flash memory device and method that reduces a number of decoders.

Another object of the present invention is to provide a flash memory device and method having a reduced size by decreasing a proportional size of word line decoders in the device.

Another object of the present invention is to provide a flash memory device and method having a memory cell array divided into sectors made of sub-sectors and an erasing operation performed by sectors.

Another object of the present invention is to provide a flash memory device and method operating a memory cell array divided in sectors that further sub-divides the sectors into two or more sub-sectors, and couples a word line linked to a memory cell inside the sub-sector to a word line linked to a memory cell inside a different sub-sector to reduce a layout size.

In order to achieve at least the above-described objects in a whole or in parts, in accordance with the present invention, there is provided a flash memory device in which a memory sector is divided into two or more sub-sectors, and a word line among a plurality of word lines respectively linked to the gates of a plurality of memory cells inside one sub-sector is commonly connected to a word line among a plurality of word lines respectively linked to the gates of a plurality of memory cells inside another sub-sector. That is, a first word line inside a first sub-sector and a first word line inside a second word line are preferably commonly coupled to a word line decoder. In addition, the respective sources of all the memory cells inside the entire memory sector are commonly connected. In this case, the total number of the word line decoders is advantageously reduced approximately in half relative to the number of the word line decoders in a related art device.

In order to achieve at least the above-described objects in a whole or in parts, in accordance with the present invention, there is provided a flash memory device that includes a sector of memory cells, a first plurality of memory cells in the sector having a matrix form, a first signal line coupled to respective control electrodes of a row in the first plurality of memory cells, a first plurality of second signal lines that each couple second electrodes of corresponding ones of the first plurality of memory cells located in identical columns, a second plurality of memory cells in the sector having a matrix form, a third signal line coupled to respective control electrodes of a row of the second plurality of memory cells, a second plurality of second signal lines that each couple second electrodes of corresponding ones of the second plurality of memory cells located in identical columns, a first select unit that selectively couples the first plurality of second signal lines with corresponding fourth signal lines and a second select unit that selectively couples the second plurality of second signal lines with the corresponding fourth signal lines, wherein the first signal line and the third signal line are commonly coupled.

To further achieve at least the above-described objects in a whole or in parts, in accordance with the present invention, there is provided a flash memory device that includes a plurality of bit lines, a sector select decoder, a sub-sector select decoder and at least one memory sector divided into a plurality of memory sub-sectors, wherein a first memory sub-sector of the plurality of memory sub-sectors has at least one first memory cell, a first word line coupled to a control electrode of the first memory cell, a first local bit line coupled to a second electrode of the first memory cell, and a first selection unit that selectively couples a corresponding one of the bit lines to the first local bit line based on the sector select decoder, and wherein a second memory sub-sector of the plurality of memory sub-sectors has at least one second memory cell, a second word line coupled to a control electrode of the second memory cell, a second local bit line coupled to a second electrode of the second memory cell, a second selection unit that selectively couples a corresponding one of the bit lines to the second local bit line based on the sub-sector select decoder, wherein the first word line and the second word line are commonly coupled and wherein the first electrodes of the at least one first and second memory cells are commonly connected.

To further achieve at least the above-described objects in a whole or in parts, in accordance with the present invention, there is provided a method of operating a sub-sectors in a sector of a memory device, wherein each of the sub-sectors is a plurality of memory cells having a matrix form, that includes coupling respective control electrodes of a row in a first sub-sector using a first word line, coupling second electrodes of corresponding ones of the first sub-sector located in identical columns using a first plurality of local bitlines, coupling respective control electrodes of a row in a second sub-sector using a second word line, wherein the first word line and the second word line are commonly coupled, coupling second electrodes of corresponding ones of the second sub-sector located in identical columns using a second plurality of local bitlines, selectively coupling the first plurality of local bitlines with corresponding global bitlines and selectively coupling the second plurality of local bitlines with corresponding global bitlines, wherein the respective first electrodes of the first and second sub-sectors are commonly coupled.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 3 is a is a diagram showing voltage levels of respective terminals of the memory cells during reading, writing and erasing operations;

DETAILED DESCRIPTION OF PREFERRED EMBODIMENTS

Figure 1:
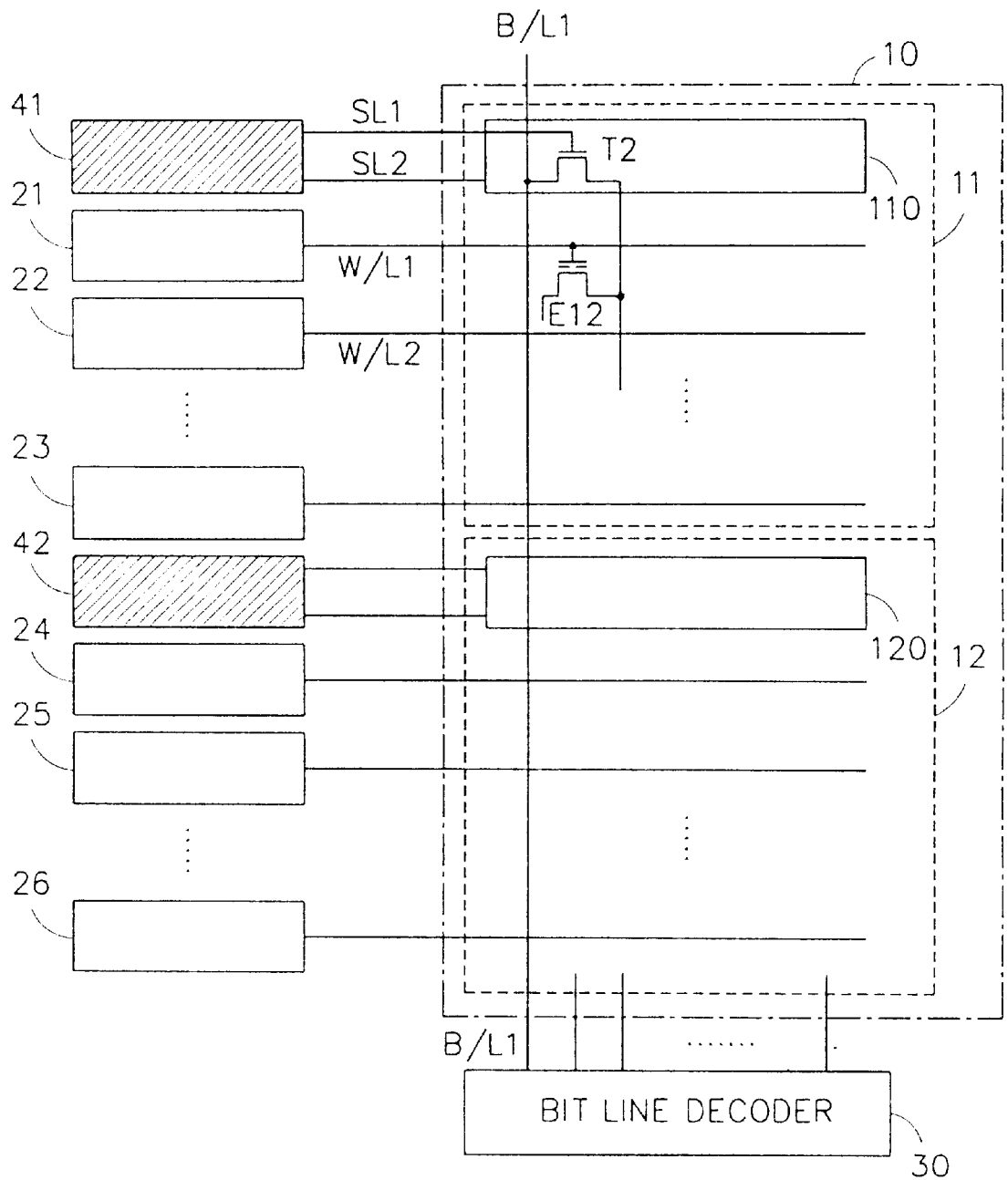
FIG. 1 is a schematic diagram showing a conventional flash memory device.
Figure 2:
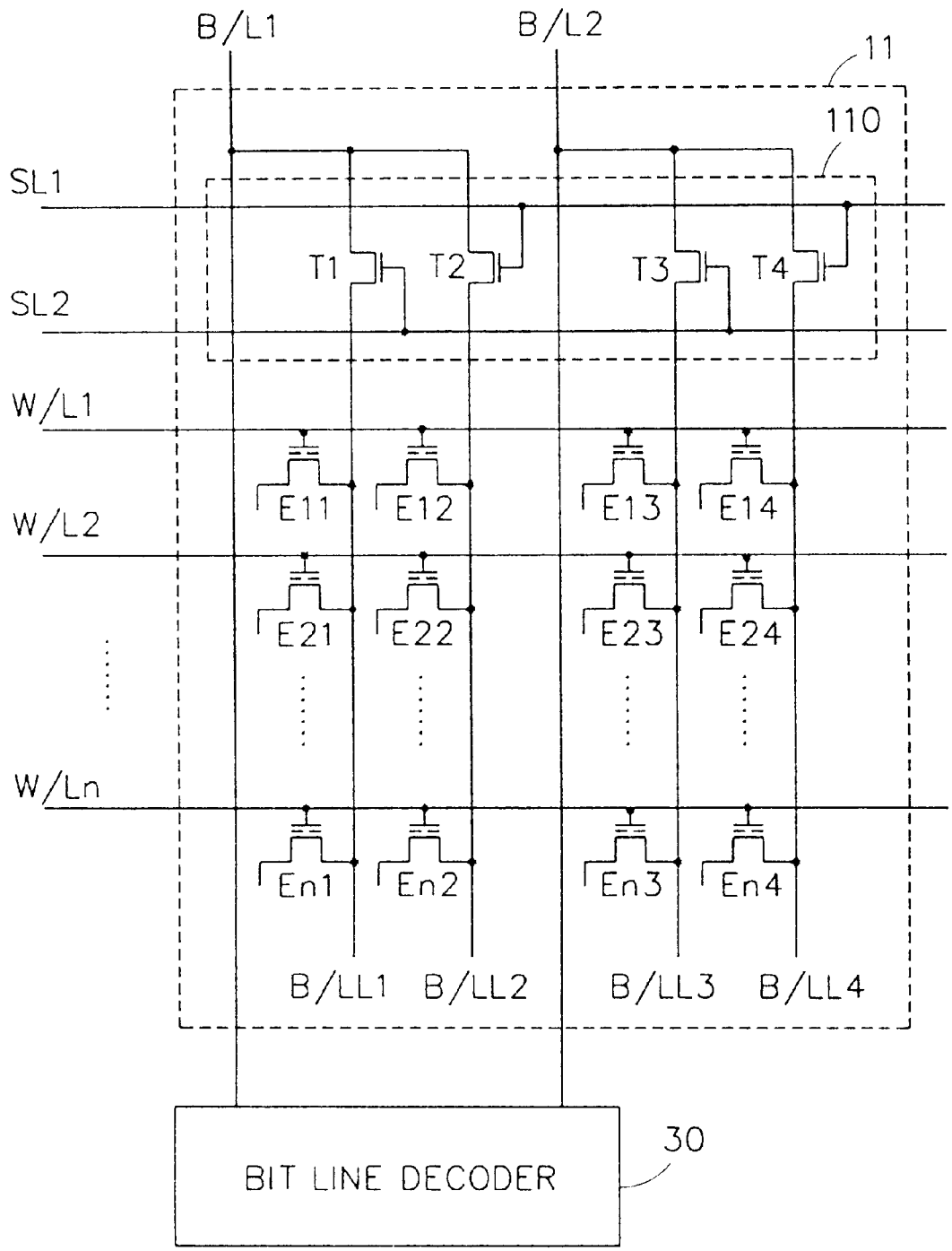
FIG. 2 is a diagram showing a memory cell array illustrated in FIG. 1.
Figure 4:
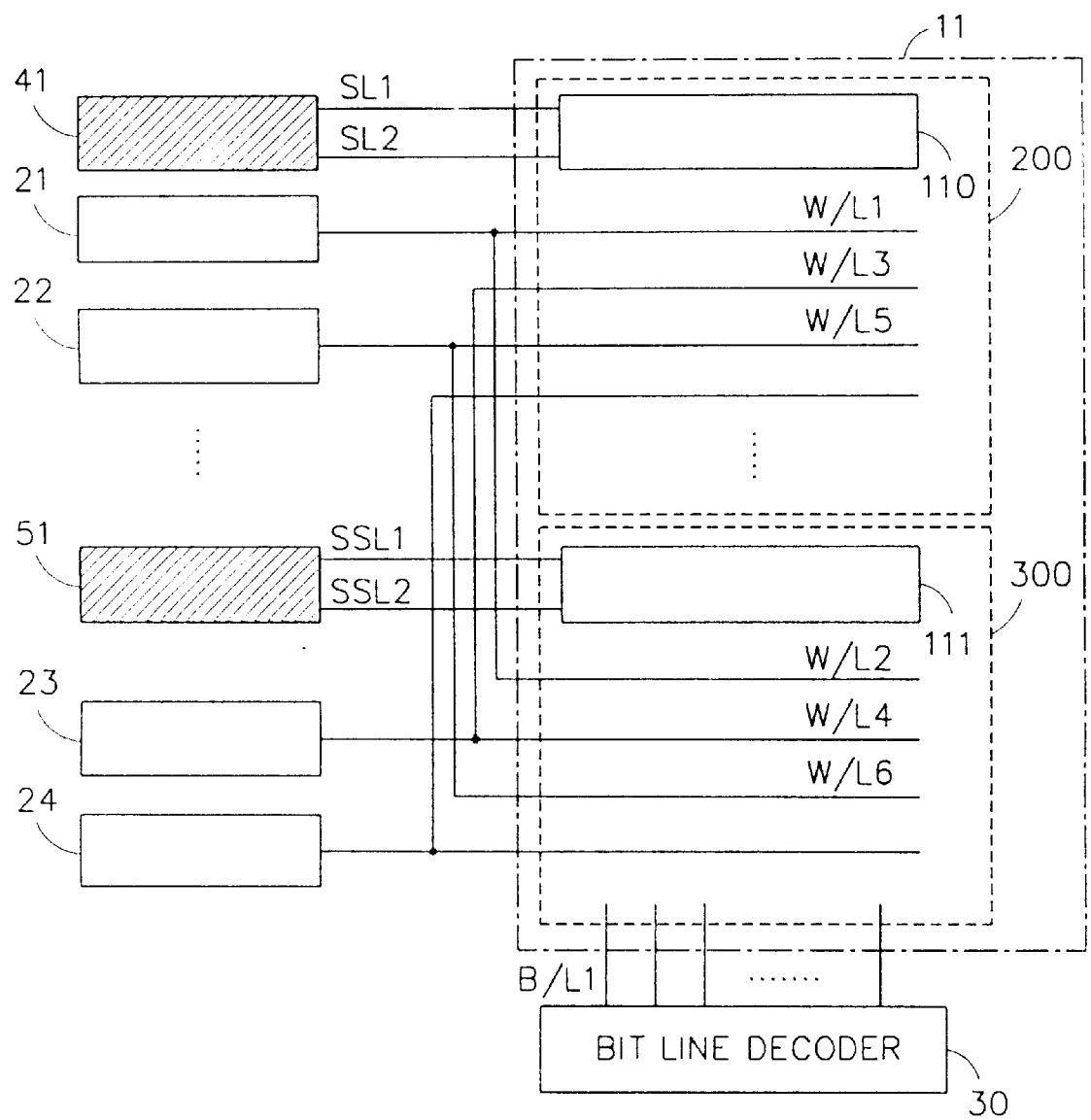
FIG. 4 is a schematic diagram showing a flash memory device in accordance with a preferred embodiment according to the present invention.

FIG. 4 is a diagram showing a flash memory device in accordance with a preferred embodiment according to the present invention. As shown in FIG. 4, a memory sector 11 being a part of a memory cell array is divided into a first memory sub-sector 200 and a second memory sub-sector 300. The memory cell array further includes a bit line decoder 30.

A sector select decoder 41 that selects all of the memory cells of the memory sector 11 in accordance with the conventional art can select only the memory cells inside the first memory sub-sector 200 according to the preferred embodiment of the present invention. A sub-sector select decoder 51 selects the memory cells inside the second memory sub-sector 300.

A sector select unit 110 is located inside the first memory sub-sector 200 and controls the connection between each cell of the first memory sub-sector 200 and each bit line B/L1, . . . , B/Ln in accordance with an operation of the sector select decoder 41. A sub-sector select unit 111 of the second memory sub-sector 300 controls the connection between each cell of the second memory sub-sector 300 and each bit line B/L1, . . . , B/Ln in accordance with an operation of the sub-sector select decoder 51.

The memory sector 11 includes a plurality of word line decoders 21~24. A first word line decoder 21 is commonly coupled to a first word line W/L1 of the first memory sub-sector 200 and a first word line W/L2 of the second memory sub-sector 300. The word line decoder 22 is commonly coupled to a third word line W/L5 of the first memory sub-sector 200 and a third word line W/L6 of the second memory sub-sector 300. The word line decoder 23 is commonly coupled to a second word line W/L3 of the first memory sub-sector 200 and a second word line W/L4 of the second memory sub-sector 300.

Figure 5:
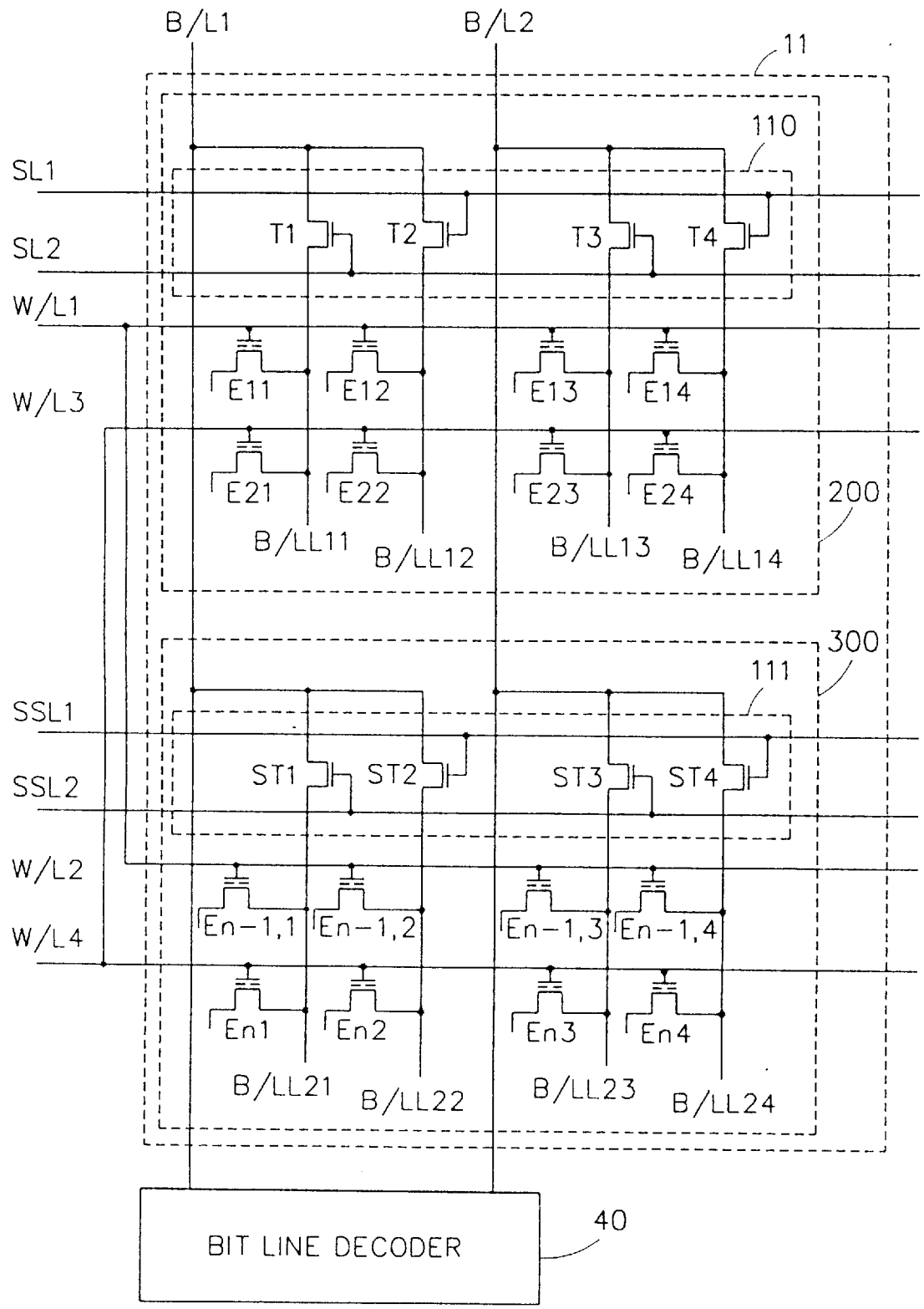
FIG. 5 is a diagram showing a memory sector of FIG. 4.

FIG. 5 is a detailed diagram showing the memory sector 11 according to the preferred embodiment illustrated in FIG. 4. The first memory sub-sector 200 includes a plurality of first memory cells E11~E24 and a plurality of first local bit lines B/LL11~B/LL14 commonly coupling drains of the memory cells (E11, E21) (E12, E22) (E13, E23) (E14, E24) located in the same columns among the plurality of first memory cells E11~E24. The sector select unit 110 couples or decouples the plurality of first local bit lines B/LL11~B/LL14 with global bit lines B/L1, B/L2 in accordance with the operation of the sector select decoder 41.

The sector select unit 110 preferably includes four select transistors T1~T4. The constitution of the sector select unit 110 is similar to the conventional sector select unit 110. Accordingly, a detailed description is omitted.

The second memory sub-sector 300 includes a plurality of cells En-1,1~En4 and a plurality of second local bit lines B/LL21~B/LL24 for commonly coupling drains of the memory cells (En-1,1, En1)(En-1,2, En2)(En-1,3, En3)(En-1,4, En4) located in the same columns among the plurality of memory cells En-1,1~En4. The sub-sector select unit 111 couples or decouples the plurality of second local bit lines B/LL21~B/LL24 with the global bit lines B/L1, B/L2. The sources of all the memory cells inside the entire memory sector 11 are commonly connected.

The constitution of the sub-sector select unit 111 is similar to the sub-sector select unit 110. Preferably, four select transistors ST1~ST4 respectively couple or decouple the second local bit lines B/LL21~B/LL24 with the global bit lines B/L1, B/L2 in accordance with the operation of the sub-sector select decoder 51. The gates of the select transistors ST1~ST4 are coupled to select lines SSL1~SSL2 extending from the sub-sector select decoder 51.

As shown in FIG. 5, the select transistors T1~T4, ST1~ST4 are preferably NMOS transistors.

Operations of the flash memory device in accordance with the preferred embodiment of the present invention will now be described. Two word lines are selected by a word line decoder (not shown) under the condition that one global bit line is enabled. Here, when the sector select decoder 41 outputs a predetermined voltage through one of the sector select lines SL1, SL2, a memory cell being inside the first memory subsector 200 is selected. When the sub-sector select decoder 51 outputs a predetermined voltage through one of the sector select lines SSL1, SSL2, a memory cell inside the second memory sub-sector 300 is selected. Accordingly, a memory cell is selected in the memory sector 11 for the reading and writing operations. Although, the preferred embodiment is described having two sectors 200, 300 in a plurality of memory cells E11, . . . ,En4 in a array, the present invention is not intended to be so limited. For example, three sectors or three bit lines could be used.

In other words, if the first word line W/L1 of the first memory sub-sector 200 and the first word line W/L2 of the second memory sub-sector 300 are enabled and commonly coupled, the memory cells E11~E14 located in a first row of the first memory sub-sector 200 and the memory cells En-1,1 En~1,4 located in a first row of the second memory sub-sector 300 are simultaneously selected. In this case, the sector select decoder 41, for example, can operate the sector select unit 110 and the sub-sector select decoder 51 does not operate the sub-sector select unit 111. Therefore, the memory cells E1~E14 are selected and the memory cells En-1,1~En-1,4 are not selected.

For example, when the sector select decoder 41 outputs a high-level voltage through the sector select line SL1 and a low-level voltage through the sector select line SL2, the select transistors T2, T4 are turned on and the select transistors T1, T3 are turned off. When the select transistors T2, T4 turn on, the global bit lines B/L1, B/L2 and the local bit lines B/LL12, B/LL14 are respectively coupled. At this time, if the first word line W/L1 and the first global bit line B/L1 are enabled, the memory cell E12 is selected. The sub-sector select decoder 51 outputs a low-level voltage on the two sector select lines SSL1, SSL2 to turn off the select transistors ST1~ST4 of the sub-sector select unit 111. That is, the second local bit lines B/LL21~B/LL24 are not coupled to the global bit lines B/L1, B/L2. Therefore, the reading and writing operations can be performed only on the memory cell E12.

In accordance with the preferred embodiment of the flash memory device according to the present invention, when the reading, writing and erasing operations are performed, the voltage levels of the respective terminals of the memory cell are preferably shown in FIG. 3. However, the voltage levels of the preferred embodiment of the flash memory device are not intended to be so limited.

Erasing operations for the preferred embodiment will now be described. As the sources of the respective cells E1–En4 of the memory sector 11 are preferably commonly coupled, the erasing operation is simultaneously performed on all the cells of the entire memory sector 11.

When the sector select decoder 41 outputs a low-level voltage through the two sector select lines SL1, SL2, the select transistors T1~T4 of the sector select unit 110 are turned off. Thus, the global bit lines B/L1, B/L2 and the local bit lines (B/LL11, B/LL12) (B/LL13, B/LL14) are not coupled. When the sub-sector select decoder 51 outputs a low-level voltage through the two sub-sector select lines SSL1, SSL2, the select transistors ST1~ST4 of the sub-sector select unit 111 are turned off, and thus the global bit lines B/L1, B/L2 and the local bit lines (B/LL21, B/LL22) (B/LL23, B/LL24) are not coupled. Consequently, the drains of all the memory cells E11~En4 are in a floating condition. At this time, the word line decoders 21~24 apply a voltage of −8 V~12 V on the word lines W/L1~W/L4 and an erasing voltage of 5 V~7 V is applied to the sources of the respective memory cells. Therefore, the erasing operation is simultaneously performed on all the memory cells E11~En4.

In accordance with the preferred embodiment of the flash memory device according to the present invention, a memory sector is sub-divided into two sub-sectors. However, the present invention is not intended to be so limited. For example, according to the present invention, a sector can be divided into more than two sub-sectors, if necessary. In this case, the reading and writing operations are also performed byword line units and the erasing operation is performed by sector units. Accordingly, operations of such devices would be similar to that of the preferred embodiment of the present invention.

In accordance with the present invention, a memory cell array of a device is divided into a plurality of memory sectors, the plurality of memory sectors are each sub-divided into a plurality of sub-sectors, and a word line inside one sub-sector is commonly coupled to a word lines inside a different sub-sector. Therefore, a plurality of word lines can be commonly coupled to one word line decoder. For example, if a sector is divided into two sub-sectors and the number of the word lines of the memory cell array is 256, only 128 word line decoders are required. If one sector is divided into three or more sub-sectors, the number of required word line decoders can be further reduced.

However, in the preferred embodiment of the flash memory device, when a sector is divided into a plurality of sub-sectors, a sub-sector select decoder must be added for each of the sub-divisions. A number of additional sub-sector select decoders is very small compared to the reduction in the number of word line decoders.

As described above, the preferred embodiment of the memory device according to the present invention has various advantages. In accordance with the preferred embodiment, the number of the required word line decoders is reduced approximately by half, as compared with the conventional art. Consequently, the entire layout of the flash memory device can be considerably reduced. Thus, size and power requirements can be reduced.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A memory device, comprising:

a sector of memory cells;

a first plurality of memory cells in the sector having a matrix form;

a first signal line coupled to respective control electrodes of a row in the first plurality of memory cells;

a first plurality of second signal lines that each couple second electrodes of corresponding ones of the first plurality of memory cells located in identical columns;

a second plurality of memory cells in the sector having a matrix form;

a third signal line coupled to respective control electrodes of a row of the second plurality of memory cells;

a second plurality of second signal lines that each couple second electrodes of corresponding ones of the second plurality of memory cells located in identical columns;

a first select unit that selectively couples the first plurality of second signal lines with corresponding fourth signal lines; and a second select unit that selectively couples the second plurality of second signal lines with the corresponding fourth signal lines, wherein the first signal line and the third signal line are commonly coupled.

2. The memory device of claim 1, wherein the first plurality of memory cells is a first memory sub-sector and the second plurality of second memory cells is a second memory sub-sector, and wherein the respective first electrodes of the first and second pluralities of memory cells are commonly coupled.

3. The memory device of claim 2, wherein the first memory sub-sector further comprises a first decoder that drives the first select unit by applying one of prescribed voltages, and wherein the second memory sub-sector further comprises a second decoder that drives the second select unit by applying one of prescribed voltages.

4. The memory device of claim 3, wherein the first select unit comprises a plurality of select transistors having respective second electrodes coupled to a corresponding fourth signal line, respective first electrodes coupled to a corresponding one of the first plurality of second signal lines and respective control electrodes coupled to the first decoder.

5. The memory device of claim 4, wherein the select transistors are NMOS transistors.

6. The memory device of claim 3, wherein the second select unit comprises a plurality of connection devices, wherein each of the connection devices is coupled to the second decoder to selectively couple one of the second plurality of second signal lines to a corresponding fourth signal line.

7. The memory device of claim 1, wherein the first signal line comprises a plurality of first sub-word lines, wherein the third signal line comprises a plurality of second sub-word lines, and wherein corresponding ones of the first and second sub-word lines are connected together.

8. The memory device of claim 1, wherein the first select unit selectively couples and decouples the first plurality of second signal lines with the corresponding fourth signal lines.

9. The memory device of claim 1, wherein the control electrodes are gate electrodes, the first electrodes are source electrodes and the second electrodes are drain electrodes, and wherein the first and third signal lines are word lines, the first and second plurality of second signal lines are local bitlines, and the fourth signal lines are bit lines.

10. A memory device, comprising:

a plurality of memory cells divided into first and second arrays of columns and rows;

a first plurality of word lines coupled to the first array;

a second plurality of word lines coupled to the second array;

a plurality of bit lines coupled to first and second arrays;

a first selector unit coupled to the plurality of bit lines and the first array to select a corresponding column of memory cells based on at least one first control signal; and a second selector unit coupled to the plurality of bit lines and the second array to select a corresponding column of memory cells based on at least one second control signal, wherein each of the first plurality of word lines is commonly coupled to a corresponding one of the second plurality of word lines.

11. The memory device of claim 10, wherein the first memory array is a first sub-sector of the plurality of memory cells, comprising:

at least one first memory cell;

a first word line coupled to a control electrode of the first memory cell;

a first local bit line coupled to a second electrode of the first memory cell; and a third selector unit that selectively couples a corresponding one of the bit lines to the first local bit line based on the first selector unit, and wherein the second memory array is a second sub-sector of the plurality of memory cells comprising:

at least one second memory cell;

a second word line coupled to a control electrode of the second memory cell;

a second local bit line coupled to a second electrode of the second memory cell;

a fourth selector unit that selectively couples a corresponding one of the bit lines to the second local bit line based on the second selector unit, wherein the first word line and the second word line are commonly coupled, and wherein the first electrodes of the at least one first and second memory cells are commonly connected.

12. The memory device of claim 11, wherein a control electrode of the third selector unit of the first memory sub-sector is coupled to the first selector unit through a select line, a second electrode is coupled to one of the bit lines and a first electrode is coupled to the first local bit line.

13. The memory device of claim 11, wherein a control electrode of the fourth selector unit of the second memory sub-sector is coupled to the second selector unit through the select line, a second electrode is coupled to said one of the bit lines and a first electrode is coupled to the second local bit line.

14. The memory device of claim 11, wherein the third and fourth selector units are transistors.

15. A method of operating a sub-sectors in a sector of a memory device, wherein each of the sub-sectors is a plurality of memory cells having a matrix form, the method comprising:

coupling respective control electrodes of a row in a first sub-sector using a first word line;

coupling second electrodes of corresponding ones of the first sub-sector located in identical columns using a first plurality of local bitlines;

coupling respective control electrodes of a row in a second sub-sector using a second word line, wherein the first word line and the second word line are commonly coupled;

coupling second electrodes of corresponding ones of the second sub-sector located in identical columns using a second plurality of local bitlines;

selectively coupling the first plurality of local bitlines with corresponding global bitlines; and selectively coupling the second plurality of local bitlines with corresponding global bitlines, wherein the respective first electrodes of the first and second sub-sectors are commonly coupled.

16. The method of claim 15, wherein a single memory cell in the sector is selected for one of a read operation and a write operation, and wherein all memory cells of the sector are selected for an erase operation.

* * * * *